United States Patent
Parker et al.

(10) Patent No.: US 6,689,675 B1
(45) Date of Patent: Feb. 10, 2004

(54) METHOD FOR MAKING A SEMICONDUCTOR DEVICE HAVING A HIGH-K GATE DIELECTRIC

(75) Inventors: Christopher G. Parker, Portland, OR (US); Markus Kuhn, Hillsboro, OR (US); Ying Zhou, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/285,915

(22) Filed: Oct. 31, 2002

(51) Int. Cl.[7] ................. H01L 21/3205; H01L 21/4763
(52) U.S. Cl. .............. 438/585; 438/287; 438/591; 438/770; 438/772; 438/785
(58) Field of Search ....................... 257/410, 411; 438/197, 287, 585, 591, 765, 770–772, 775–778, 785

(56) References Cited

U.S. PATENT DOCUMENTS

| | | | |
|---|---|---|---|
| 5,625,217 A | 4/1997 | Chau et al. | 257/412 |
| 5,783,478 A | 7/1998 | Chau et al. | 438/592 |
| 5,891,798 A | 4/1999 | Doyle et al. | 438/624 |
| 6,184,072 B1 * | 2/2001 | Kaushik et al. | 438/197 |
| 6,306,742 B1 | 10/2001 | Doyle et al. | 438/591 |
| 6,420,279 B1 * | 7/2002 | Ono et al. | 438/785 |
| 6,544,906 B2 * | 4/2003 | Rotondaro et al. | 438/585 |
| 2003/0032303 A1 * | 2/2003 | Yu et al. | 438/770 |

OTHER PUBLICATIONS

Doug Barlage et al., "High–Frequency Response of 100nm Integrated CMOS Transistors with High–K Gate Dielectrics", 2001 IEEE, 4 pages.

Robert Chau et al., A 50nm Depleted–Substrate CMOS Transistor (DST), 2001 IEEE, 4 pages.

* cited by examiner

Primary Examiner—Kamand Cuneo
Assistant Examiner—Asok Kumar Sarkar
(74) Attorney, Agent, or Firm—Mark V. Seeley

(57) ABSTRACT

A method for making a semiconductor device is described. That method comprises forming a high-k gate dielectric layer on a substrate, oxidizing the surface of the high-k gate dielectric layer, and then forming a gate electrode on the oxidized high-k gate dielectric layer.

3 Claims, 1 Drawing Sheet

METHOD FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. As the thickness of such a high-k gate dielectric is reduced, however, silicide formation—which may result from high temperature processing that follows gate dielectric formation—may cause the device to short through the dielectric.

Accordingly, there is a need for an improved process for making a semiconductor device that includes a high-k gate dielectric. There is a need for such a process that can produce a device that includes an ultra thin high-k gate dielectric that is not shorted through the gate dielectric. The method of the present invention provides such a process.

DETAILED DESCRIPTION OF THE PRESENT INVENTION

A method for making a semiconductor device is described. That method comprises forming a high-k gate dielectric layer on a substrate. After the surface of the high-k gate dielectric layer is oxidized, a gate electrode is formed on that surface. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In an embodiment of the method of the present invention, a high-k gate dielectric layer is formed on a substrate. That substrate may comprise a bulk silicon or silicon-on-insulator substructure. Alternatively, it may comprise other materials—which may or may not be combined with silicon—such as: germanium, indium antimonide, lead telluride, indium arsenide, indium phosphide, gallium arsenide, or gallium antimonide. Although several examples of materials from which the substrate may be formed are described here, any material that may serve as a foundation or base upon which a semiconductor device may be built falls within the spirit and scope of the present invention.

When the substrate comprises a silicon wafer, the wafer should be cleaned before forming the high-k gate dielectric layer on its surface. To clean the wafer, it may initially be exposed to a dilute hydrofluoric acid ("HF") solution, e.g., a 50:1 water to HF solution. The wafer may then be placed in a megasonic tank, and exposed first to a water/hydrogen peroxide ("$H_2O_2$")/ammonium hydroxide ("$NH_4OH$") solution, then to a water/$H_2O_2$/hydrochloric acid ("HCl") solution. The water/$H_2O_2$/$NH_4OH$ solution may remove particles and organic contaminants, and the water/$H_2O_2$/HCl solution may remove metallic contaminants. This cleaning treatment may cause a thin chemical oxide (not shown) to form on silicon wafer 100. That oxide may be less than about 5 angstroms thick.

Figure 1A:
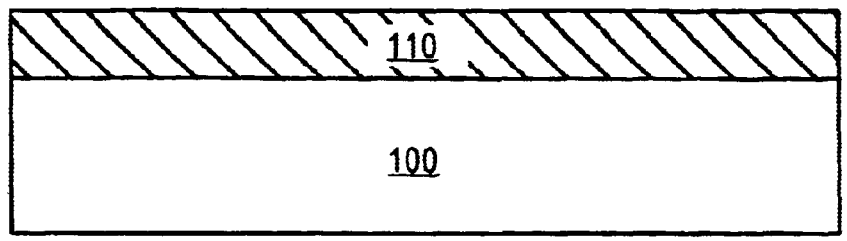
FIGS. 1a–1c represent cross-sections of structures that may be formed when carrying out an embodiment of the method of the present invention.

After that cleaning treatment, high-k gate dielectric layer 110 may be formed on substrate 100 to generate the structure illustrated by FIG. 1a. High-k gate dielectric layer 110 comprises a material with a dielectric constant that is greater than the dielectric constant of silicon dioxide. Dielectric layer 110 preferably has a dielectric constant that is at least about twice that of silicon dioxide, i.e., a dielectric constant that is greater than about 8. Materials that may be used to make high-k gate dielectrics include: hafnium oxide, lanthanum oxide, zirconium oxide, zirconium silicon oxide, titanium oxide, tantalum oxide, yttrium oxide, and aluminum oxide. Particularly preferred are hafnium oxide, zirconium oxide, titanium oxide, and aluminum oxide. Although a few examples of materials that may be used to form dielectric layer 110 are described here, that layer may be made from other materials that serve to reduce gate leakage.

High-k gate dielectric layer 110 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 110. The CVD reactor should be operated long enough to form a layer with the desired thickness. In most applications, dielectric layer 110 should be less than about 50 angstroms thick, and more preferably between about 5 angstroms and about 40 angstroms thick.

In the method of the present invention, high-k gate dielectric layer 110 is then reoxidized. In a preferred embodiment, a direct plasma enhanced chemical vapor deposition ("PECVD") process or a remote plasma enhanced chemical vapor deposition ("RPECVD") process is used to reoxidize high-k gate dielectric layer 110. In such a PECVD or RPECVD process, the surface of high-k gate dielectric layer 110 may be oxidized by exposing that surface to ionized oxygen species generated by a plasma source. When a PECVD process is used, such ionized oxygen species may be generated, for example, by feeding oxygen, nitrous oxide or a mixture of oxygen and nitrous oxide into the reactor, then striking a plasma within the reactor. When a RPECVD process is used, the plasma may be stricken remotely, and then the resulting ionized oxygen species may be fed into the reactor. Alternatively, ionized oxygen species may be created by striking a plasma remotely using a carrier gas, e.g., argon or helium, feeding the resulting ionized components into the reactor, then feeding oxygen, nitrous oxide or a mixture of oxygen and nitrous oxide into the reactor—downstream from the plasma source.

The reactor should be operated under the appropriate conditions (e.g., pressure, radio frequency, and power) for a sufficient time to significantly increase the ratio of oxygen to metal at the surface of the dielectric layer, thereby reducing potential sites for silicidation during subsequent high temperature processing. In a preferred embodiment, that reoxidation step takes place at a relatively low temperature, e.g., at a temperature that is less than about 500° C. By reoxidizing high-k gate dielectric layer 110 at a relatively low temperature, the high-k gate dielectric layer may retain its amorphous state, and the amount of oxygen that diffuses to the silicon interface may be reduced. This, in turn, may limit the amount of additional oxide growth at that interface.

Figure 1B:
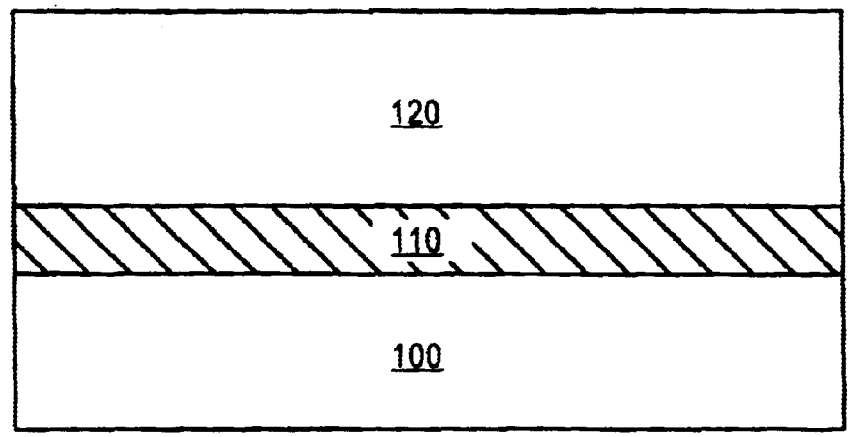
Figure 1C:
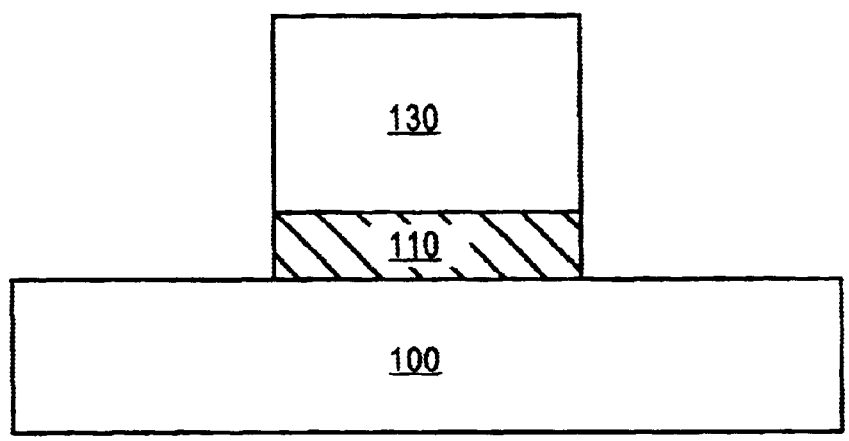

After oxidizing high-k gate dielectric layer 110, a gate electrode may be formed on it. In a preferred embodiment, the gate electrode may be formed by initially depositing polysilicon layer 120 on high-k gate dielectric layer 110—generating the FIG. 1*b* structure. Polysilicon layer 120 may be deposited using conventional methods and preferably is between about 500 angstroms and about 4,000 angstroms thick. After etching layers 120 and 110 to form the FIG. 1*c* structure, using conventional techniques, additional steps that are generally used to complete the gate electrode (e.g., forming a silicide (not shown) on the upper part of etched polysilicon structure 130) may be applied. As such steps are well known to those skilled in the art, they will not be described in more detail here. Although the gate electrode preferably comprises polysilicon, it may alternatively be formed from various metals with which the above described high-k gate dielectrics may be used.

The process described above may produce a device with an ultra thin high-k gate dielectric that is not shorted through the gate dielectric. Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
   forming on a substrate a high-k gate dielectric layer;
   oxidizing the surface of the high-k gate dielectric layer by exposing that surface to ionized oxygen species that are generated by striking a plasma remotely using a carrier gas, feeding the resulting ionized components into a reactor, then feeding oxygen, nitrous oxide or a mixture of oxygen and nitrous oxide into the reactor downstream from the plasma source; and then
   forming a gate electrode on the oxidized high-k gate dielectric layer.

2. A method for making a semiconductor device comprising:
   cleaning a silicon wafer by:
      exposing the silicon wafer to a first solution that comprises hydrofluoric acid; then
         placing the silicon wafer in a megasonic tank and exposing the silicon wafer to a second solution that comprises water, hydrogen peroxide, and ammonium hydroxide and then to a third solution that comprises water, hydrogen peroxide, and hydrochloric acid;
   forming a high-k date dielectric layer on the silicon wafer after the silicon wafer has been cleaned, the high-k date dielectric layer comprising a material selected from the group consisting of hafnium oxide, zirconium oxide, titanium oxide, and aluminum oxide;
   oxidizing the surface of the high-k gate dielectric layer by striking a plasma remotely using a carrier gas, feeding the resulting ionized components into a reactor, feeding oxygen, nitrous oxide or a mixture of oxygen and nitrous oxide into the reactor downstream from the plasma source, and then exposing the high-k gate dielectric layer to the resulting ionized oxygen species at a temperature that is less than about 500° C.; and then
   forming a layer that comprises polysilicon on the oxidized high-k gate dielectric layer.

3. A method for making a semiconductor device comprising:
   forming on a silicon wafer a chemical oxide that is less than about 5 angstroms thick by:
      exposing the silicon wafer to a first solution that comprises hydrofluoric acid; then
      placing the silicon wafer in a megasonic tank and exposing the silicon wafer to a second solution that comprises water, hydrogen peroxide, and ammonium hydroxide and then to a third solution that comprises water, hydrogen peroxide, and hydrochloric acid;
   forming on the chemical oxide a high-k gate dielectric layer that is formed by atomic layer chemical vapor deposition—and that is between about 5 angstroms and about 40 angstroms thick;
   oxidizing the surface of the high-k gate dielectric layer by striking a plasma remotely using a carrier gas, feeding the resulting ionized components into a reactor, feeding oxygen, nitrous oxide or a mixture of oxygen and nitrous oxide into the reactor downstream from the plasma source, and then exposing the high-k gate dielectric layer to the resulting ionized oxygen species at a temperature that is less than about 500° C.; then
   forming a layer that comprises polysilicon on the oxidized surface of the high-k gate dielectric layer; and
   etching the polysilicon containing layer and the high-k gate dielectric layer.

* * * * *